(12) United States Patent
Liao

(10) Patent No.: US 10,297,657 B2
(45) Date of Patent: May 21, 2019

(54) MAGNETIC CORE INDUCTORS FOR INTEGRATED VOLTAGE REGULATOR

(71) Applicant: Taiwan Semiconductor Manufacturing Co., Ltd., Hsin-Chu (TW)

(72) Inventor: Wen-Shiang Liao, Toufen Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/686,993

(22) Filed: Aug. 25, 2017

(65) Prior Publication Data

US 2017/0373133 A1 Dec. 28, 2017

Related U.S. Application Data

(62) Division of application No. 13/898,937, filed on May 21, 2013, now Pat. No. 9,748,324.

(51) Int. Cl.
*H01L 27/08* (2006.01)
*H01L 49/02* (2006.01)
(Continued)

(52) U.S. Cl.
CPC .............. *H01L 28/10* (2013.01); *H01F 21/02* (2013.01); *H02M 3/1584* (2013.01);
(Continued)

(58) Field of Classification Search
CPC .. H01F 27/365; H01F 38/14; H01F 2027/348; H02J 5/005; H02J 7/025; H05K 9/007; H01L 2924/0002
(Continued)

(56) References Cited

U.S. PATENT DOCUMENTS 5,070,317 A * 12/1991 Bhagat ................. B81B 7/0077
257/531
5,877,667 A * 3/1999 Wollesen ............ H01F 17/0033
336/181
(Continued)

OTHER PUBLICATIONS

Carlson, et al., "A Stackable Silicon Interposer with Integrated Through-Wafer Inductors," Electronic Components and Technology Conference, 2007. ECTC '07. Proceedings. 57th, pp. 1235-1238, May 29, 2007-Jun. 1, 2007.
(Continued)

*Primary Examiner* — Rajnikant B Patel
(74) *Attorney, Agent, or Firm* — Eschweiler & Potashnik, LLC

(57) ABSTRACT

A device includes an insulating layer disposed over a silicon substrate. The insulating layer includes a core insulating area and a peripheral insulating area. A trench laterally encloses the core insulating area and separates the core insulating area from the peripheral insulating area. A magnetic winding coil is disposed within the trench and separates the core insulating area from the peripheral insulating area. A conductive inner core is disposed within the core insulating area and is surrounded by the magnetic winding coil. The conductive inner core is made of a first material that is electrically conductive, and the magnetic winding coil is made of a second material that is magnetic and differs from the first material.

20 Claims, 7 Drawing Sheets

(51) Int. Cl.
*H02M 3/158* (2006.01)
*H01F 21/02* (2006.01)
*H02M 1/00* (2006.01)
*H01F 17/00* (2006.01)

(52) U.S. Cl.
CPC ............. *H01F 2017/002* (2013.01); *H01L 2924/0002* (2013.01); *H02M 2001/0012* (2013.01)

(58) Field of Classification Search
USPC ........ 336/178, 200, 212, 223, 232; 257/531, 257/E21.022, 277; 323/282–288
See application file for complete search history.

(56) References Cited

U.S. PATENT DOCUMENTS

| | | | | |
|---|---|---|---|---|
| 5,884,990 | A * | 3/1999 | Burghartz | H01F 17/0006 29/602.1 |
| 6,188,306 | B1 * | 2/2001 | Wollesen | H01F 17/0033 336/200 |
| 6,373,153 | B1 * | 4/2002 | Hazelton | G03F 7/70758 310/12.06 |
| 6,466,401 | B1 | 10/2002 | Hong et al. | |
| 6,771,463 | B2 | 8/2004 | Kamijima | |
| 6,970,323 | B2 | 11/2005 | Kamijima | |
| 7,124,977 | B2 * | 10/2006 | Sweeney | H01F 41/08 242/434 |
| 7,319,572 | B2 | 1/2008 | Iltsuka et al. | |
| 8,042,260 | B2 | 10/2011 | Hopper et al. | |
| 8,072,042 | B1 * | 12/2011 | Kroener | H01F 41/046 257/531 |
| 8,327,523 | B2 | 12/2012 | Whitworth et al. | |
| 8,558,344 | B2 * | 10/2013 | Chen | H01L 28/10 257/531 |
| 8,697,574 | B2 * | 4/2014 | Mackh | H01L 21/76898 257/277 |
| 2004/0123449 | A1 | 7/2004 | Inaguma | |
| 2007/0090915 | A1 | 4/2007 | Zhou et al. | |
| 2007/0176726 | A1 | 8/2007 | Xu et al. | |
| 2012/0043818 | A1 * | 2/2012 | Stratakos | H02J 3/383 307/77 |

OTHER PUBLICATIONS

Kai Liu, et al., "Investigation of integrated passive device with through-silicon via," Electronic Components and Technology Conference (ECTC), 2012 IEEE 62nd, pp. 1833-1839, May 29, 2012-Jun. 1, 2012.

Gardner, et al., "Integrated On-Chip Inductors with Magnetic Films," Electron Devices Meeting, 2006. IEDM '06. International, pp. 1-4, Dec. 11, 2006-Dec. 13, 2006.

Sturcken, et al., "A 2.5D integrated voltage regulator using coupled-magnetic-core inductors on silicon interposer delivering 10.8A/mm2," Solid-State Circuits Conference Digest of Technical Papers (ISSCC), 2012 IEEE International, pp. 400-402, Feb. 19, 2012-Feb. 23, 2012.

Non-Final Office Action dated Dec. 1, 2016 for U.S. Appl. No. 13/898,937.

Notice of Allowance dated Apr. 21, 2017 for U.S. Appl. No. 13/898,937.

* cited by examiner

MAGNETIC CORE INDUCTORS FOR INTEGRATED VOLTAGE REGULATOR

REFERENCE TO RELATED APPLICATION

This Application is a Divisional of U.S. application Ser. No. 13/898,937 filed on May 21, 2013, the contents of which are hereby incorporated by reference in their entirety.

BACKGROUND

A voltage regulator is a device designed to automatically provide a relatively constant voltage level. A variety of designs can be utilized for voltage regulators including feed forward designs and control loops. Voltage regulators can also utilize electrical components and/or electromechanical components.

Voltage regulators are used in a variety of devices. They are used in power supplies to stabilize DC voltages utilized by circuits and processers. Voltage regulators are also utilized in power distribution systems to provide power at needed or usable voltage levels.

A variety of characteristics are important to the operation of voltage regulators. These include reliability, power consumption, voltage regulation performance, stability, and the like. Often, improving one characteristic is done at the expense of another.

DETAILED DESCRIPTION

Figure 1:
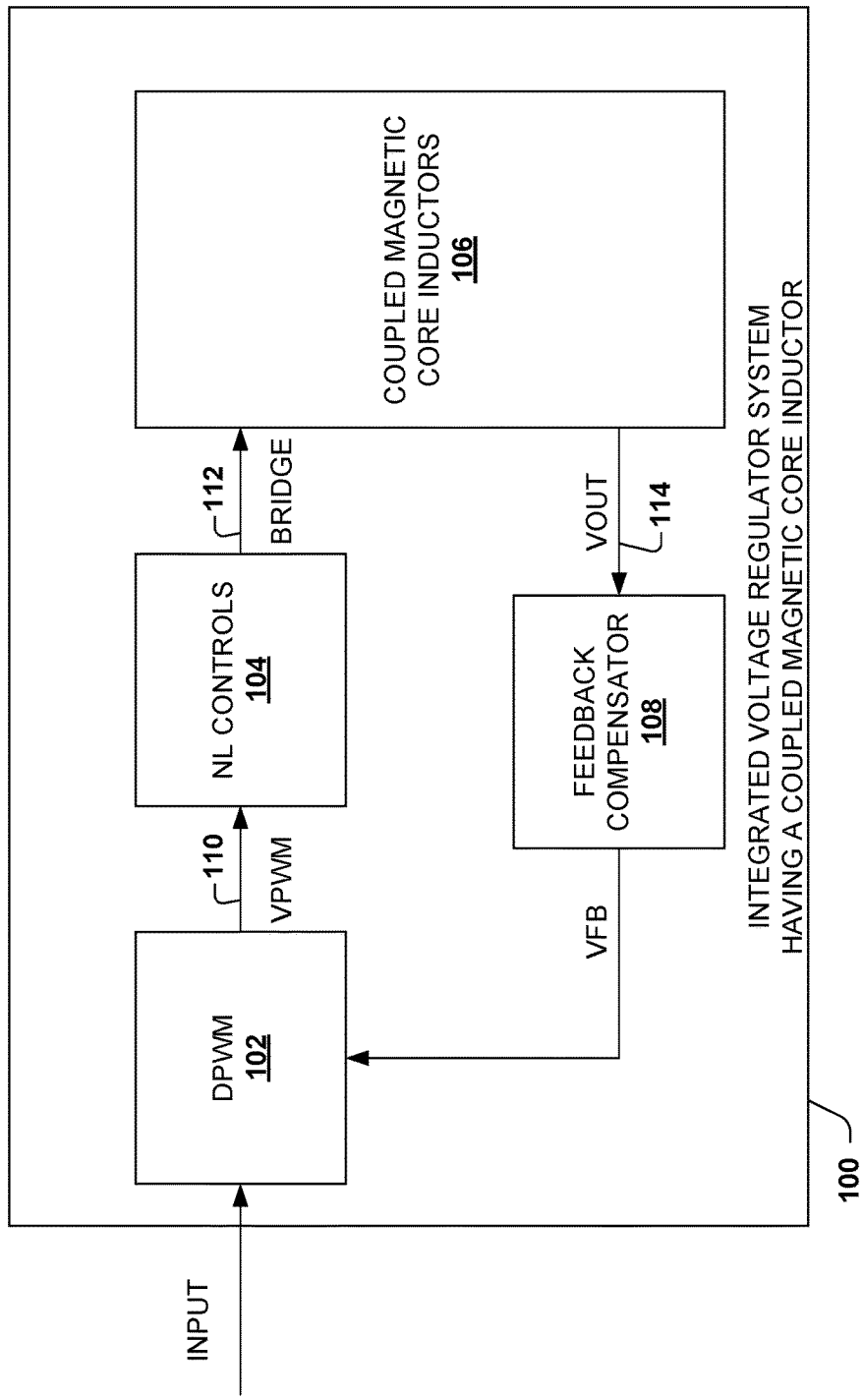
FIG. 1 is a block diagram illustrating an integrated voltage regulator and coupled-magnetic-core inductor system in accordance with an embodiment of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Systems and methods are disclosed that include an integrated voltage regulator (IVR) system with an inner conductive core and surrounding magnetic winding. The IVR system is produced with a lower cost while obtaining suitable voltage regulation and other IVR characteristics. These characteristics include, for example, drastically improving electric power consumption saving characteristics, relatively smaller form factor, shorter interconnect path, faster operation speed and broader frequency bandwidth. The power consumption savings characteristics are helpful for portable, mobile, cloud computing device packages and the like.

FIG. 1 is a block diagram illustrating an integrated voltage regulator system having a coupled-magnetic-core inductor 100 in accordance with an embodiment of the disclosure. The system 100 is described in a simplified form to facilitate understanding.

The system 100 includes a digital pulse-width modulation (DPWM) component 102, non-linear (NL) controls 104, coupled-magnetic-core inductors 106, and a feedback compensator 108. In one example, the system 100 is formed within a single package. The DPWM component 102 receives an INPUT that includes, for example, a reference signal and a voltage input signal. In one example, the INPUT includes a voltage identifier code (VIC). The DPWM component 102 also receives a voltage feedback signals (VFB). The VFB can include delay and/or voltage compensation information. The DPWM component 102 generates a plurality of pulse width modulated voltage signals 110 according to the INPUT and the VFB. The pulse width modulated voltage signals 110 are generated according to the VIC, in one example.

The non-linear controls 104 include a plurality of individual non-linear controllers and receive the pulse width modulated signals 110. Further, the non-linear controls 104 generate a plurality of bridge signals 112. The bridge signals 112 are generally provided one for one, meaning that a bridge signal is provided for each individual non-linear control. The bridge signals 112 are provided in the form of an analog voltage signal.

The coupled-magnetic-core inductors 106 include a plurality of inductive coils or inductors, typically one per bridge signal. In one example, the core inductors 106 are arranged into two sets of four coupled power inductors. The coupled-magnetic-core inductors 106 receive the bridge signals 112 and generate an output voltage or signal 114. The output signal 114 is provided at a selected, regulated voltage level. The output signal 114 can be provided to a load, such as a processor, electronic circuit, and the like.

The feedback compensator 108 also receives the output signal 114 and generates a voltage feedback signal VFB. The VFB includes delay compensation information and the like. The feedback compensator 108 can also provide feedback information to the non-linear controls 104.

In other approaches, magnetic core inductors are provided as a separate, discrete component from the other components of a voltage regulator. However, using separate, discrete components substantially increases the overall production cost. For example, using separate, discrete components may more than double the overall cost.

Integrating the coupled-magnetic-core inductors 106 with the other components of the system 100 improves a variety of characteristics, as described above. For example, the form factor (size), speed, voltage IR drop, power consumption and manufacturing cost can be drastically reduced.

Figure 2:
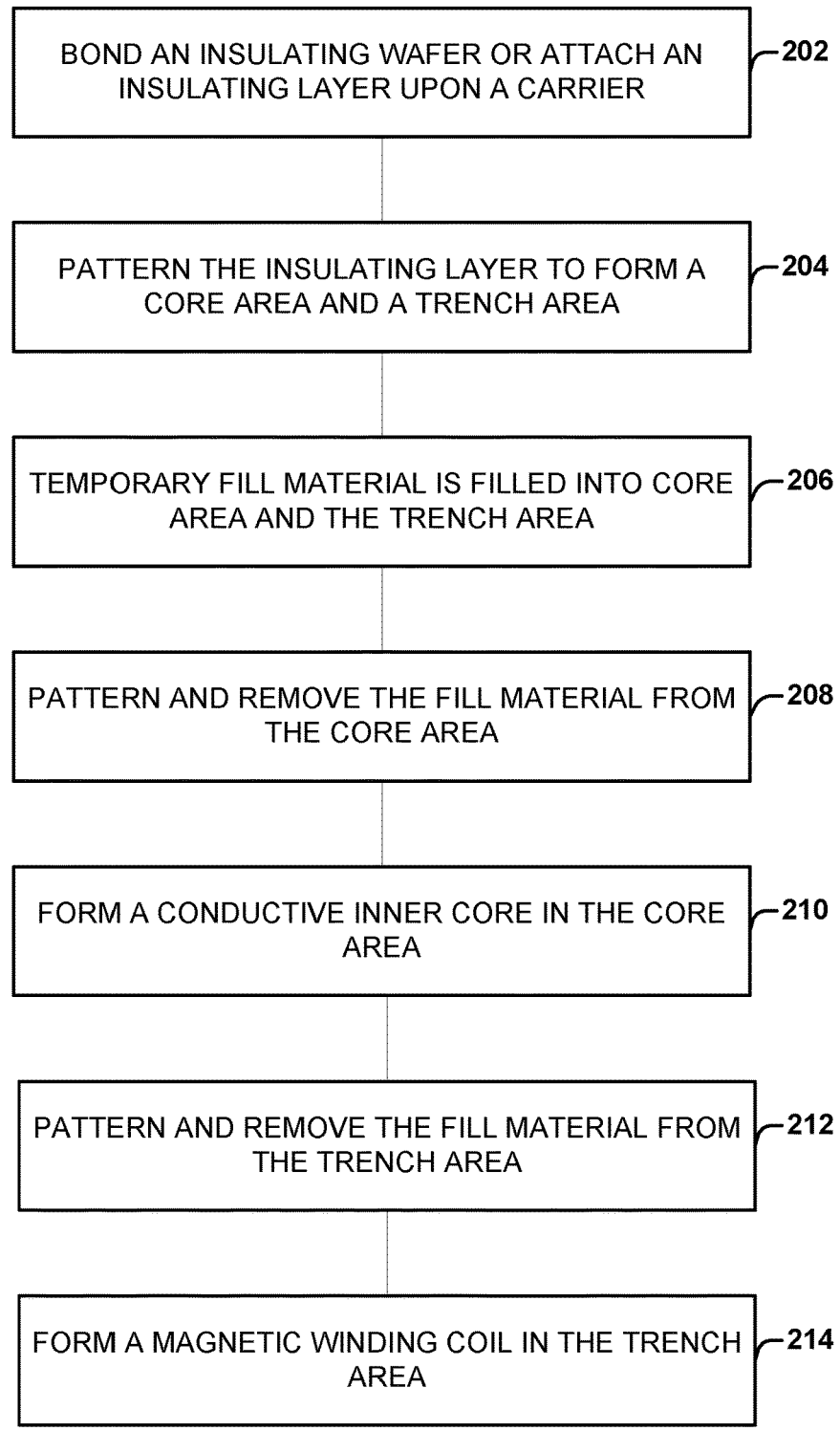
FIG. 2 is a flow diagram illustrating a method of forming an integrated voltage regulator (IVR) system with an inner conductive core and magnetic winding in accordance with an embodiment of the disclosure.

FIG. 2 is a flow diagram illustrating a method 200 of forming an integrated voltage regulator (IVR) system with an inner conductive core and magnetic winding in accordance with an embodiment of the disclosure. The method 200 describes the forming of the conductive core and magnetic winding in a bonded or coated.

The method 200 is described in conjunction with FIGS. 3A to 3J in order to facilitate understanding of the method 200. The FIGS. 3A to 3J are provided for illustrative purposes and are not intended to limit the method 200 to the arrangements shown therein.

The method 200 begins at block 202, wherein an insulating layer, such as a bonded or coated layer, is formed on or over a carrier layer. The insulating layer is comprised of a suitable material. The carrier layer includes a silicon wafer, a silicon dioxide wafer, and/or another suitable carrier material. In one example, the carrier layer is a 0.5 to 32 inch diameter wafer or panel. The upper layer is a glass substrate or the bonded or coated layer is comprised of a non-conductive or insulating material. In one example, the bonded or coated layer is formed by high-resistivity silicon, glass wafer or substrate, spin-on-glass (SOG), spin-on dielectric (SOD), polymer, ceramic, or low temperature cofired ceramic (LTCC), and the like, on the carrier layer. Some examples of suitable thicknesses for the bonded or coated layer include 0.5 to 1000 micro meters, however it is appreciated that other suitable thicknesses can be utilized.

The carrier layer is integrated with other components of an integrated voltage regulator including non-linear controllers, feedback mechanisms, DPWM components, such as are described above with regards to FIG. 1.

Figure 3A:
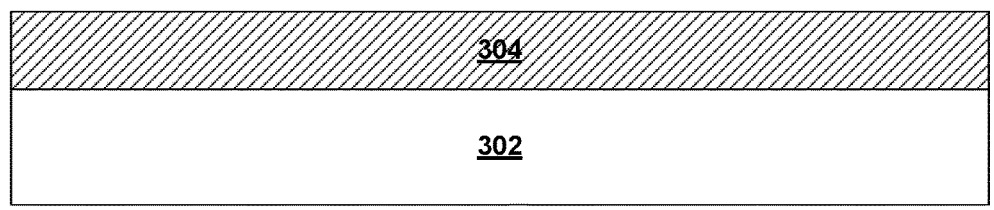
FIG. 3A is a cross sectional view showing an example semiconductor device at a first stage of fabrication in accordance with an embodiment of the disclosure.

FIG. 3A is a cross sectional view showing an example semiconductor device at a first stage of fabrication in accordance with an embodiment of the disclosure. Here, a carrier layer 302 is provided. The carrier layer 302 can simply be a silicon wafer or a silicon dioxide wafer. An electrically insulating layer 304 is shown bonded or formed on the carrier layer. The electrically insulating layer 304 is formed as described above in block 202.

Returning to FIG. 2, a patterning process is performed at block 204 to remove portions of the first layer, i.e., electrically insulting layer, such as the bonded or coated layer. The removed portions define a core area and a trench area. The patterning or removal process includes one or more suitable techniques. In one example, photolithograph is used along with RIE etching to form the areas. The core area includes a plurality of vias or holes that extend through the insulating layer. The vias have a suitable shape and dimension, such as a circle having a diameter of 10 micro meters. The number of vias is implementation dependent, such as four in one example. The trench area also extends through the insulating layer and surrounds the core area.

Figure 3B:
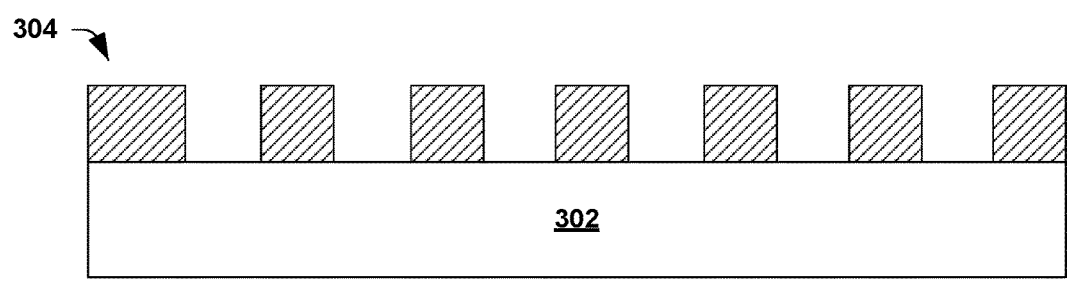
FIG. 3B is a cross sectional view showing the semiconductor device at another stage of fabrication in accordance with an embodiment of the disclosure.

FIG. 3B is a cross sectional view showing the semiconductor device at another stage of fabrication in accordance with an embodiment of the disclosure. The insulating layer 304 is shown formed on the carrier layer 302. The patterning process of block 204 has removed selected portions of the insulating layer 304.

Figure 3C:
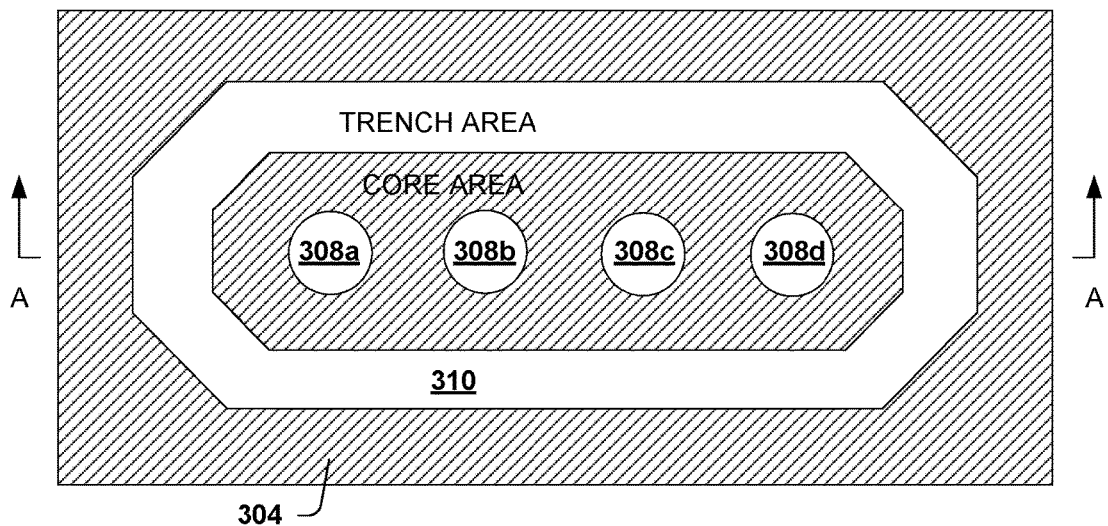
FIG. 3C is a top view showing the semiconductor device after patterning the trench and core areas.

FIG. 3C is a top view showing the semiconductor device after patterning the trench and core areas. The trench area 310 is shown formed in the insulating layer 304 and surrounding the core area 308. The trench area 310 includes a trench having a suitable width and shape, such as a width of about 10 micro meters and an oval shape. Here, the trench is shown with diagonal portions, however it is appreciated that other suitable configurations are possible, such as circular or oval.

The core area 308 includes the plurality of vias, referred to as core vias. The core vias are designated at 308*a*, 308*b*, 308*c*, and 308*d* and are collectively referred to as the core area 308.

Additionally, this view also shows a line A-A, from where the cross sectional views are based.

Returning now to FIG. 2 and the method 200, a temporary fill material is filled or deposited into the core area and the trench area at block 206. The fill material is comprised of a suitable material, such as a polymer. The fill material is deposited using a suitable technique, such as spin coating temporary materials into the core area and the trench area. The fill material fills in where the selected portions of the insulating layer had been removed. Thus, the fill material fills the core vias and the trench in the trench area. A planarization process or similar process can be utilized to remove excess fill material.

Figure 3D:
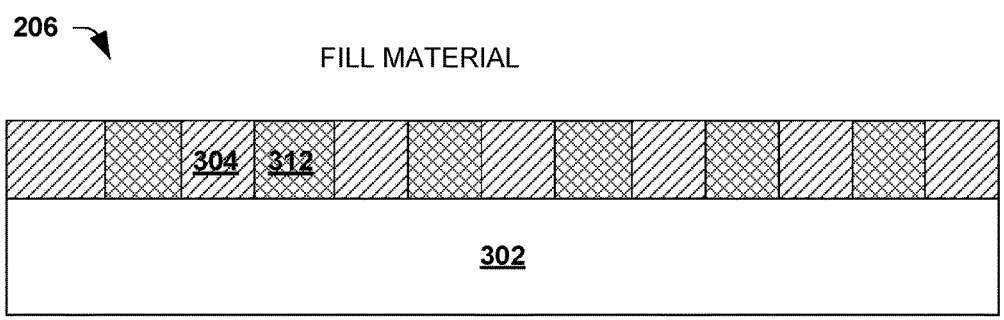
FIG. 3D is a cross sectional view illustrating the semiconductor device after a temporary fill operation in accordance with an embodiment of the disclosure.

FIG. 3D is a cross sectional view illustrating the semiconductor device after a temporary fill operation in accordance with an embodiment of the disclosure. A fill material 312 has been deposited into the core and trench areas by the fill operation performed at block 206. The fill material 312 files in removed portions of the insulating layer 304. Furthermore, it can be seen that the fill material 312 has been removed from upper surfaces of the insulating layer 304.

Returning to FIG. 2 and the method 200, the fill material is removed from the core area at block 208. The fill material is removed from the core area and remains in the trench area. A suitable process, such as photolithography and plasma etch is utilized to selectively remove the fill material. A mask or other mechanism is utilized to cover the trench area and permit removing the fill material from the core vias from within the core area.

Figure 3E:
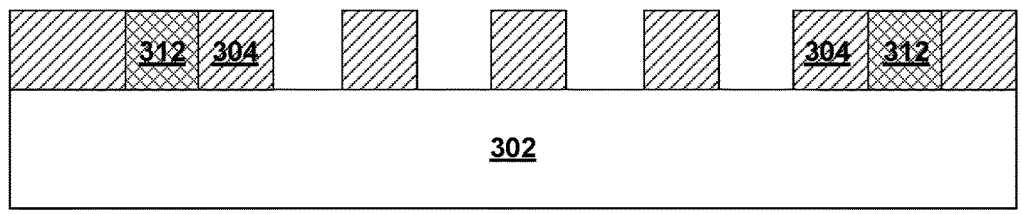
FIG. 3E is a cross sectional view illustrating the semiconductor device after removal of the fill material from the core area in accordance with an embodiment of the disclosure.

FIG. 3E is a cross sectional view illustrating the semiconductor device after removal of the fill material from the core area in accordance with an embodiment of the disclosure. Previously, the fill material 312 has been deposited in both core and trench areas of the device. However, the fill removal process of block 208 has been performed to remove portions of the fill material 312 from the core area. Thus, FIG. 3E only shows fill material 312 present in the trench area.

Returning to FIG. 2, a conductive inner core is formed in the core area at block 210. The conductive inner core is formed using a suitable process, such as conductive material seeding, electrochemical plating, sputtering, chemical vapor deposition, and the like. The conductive material is deposited via the suitable process into the core vias. Typically, a planarization process is subsequently performed to remove excess conductive material.

In one example, the conductive inner core is formed using copper (Cu) and/or a copper alloy. For this example, the copper is formed in the core area using a Cu seeding and Cu electrochemical plating processes followed by a Cu chemical mechanical planarization (CMP) process to remove excess copper material.

Figure 3F:
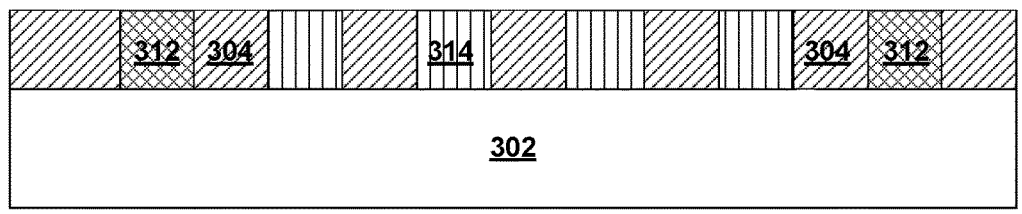
FIG. 3F is a cross sectional view illustrating the semiconductor device after formation of the conductive inner core in accordance with an embodiment of this disclosure.

FIG. 3F is a cross sectional view illustrating the semiconductor device after formation of the conductive inner core in accordance with an embodiment of this disclosure. Here, a conductive inner core 314 is shown formed within the bonded or coated layer 304. The conductive inner core 314 has been formed using the conductive core formation process of block 210.

The fill material is removed from the trench area at block 212. A suitable process is used to selectively remove the fill material from only the trench area without substantially removing the conductive inner core. In one example, plasma etching is used to selectively remove the fill material from the trench area. In another example, a solution is used to selectively remove the fill material.

Figure 3G:
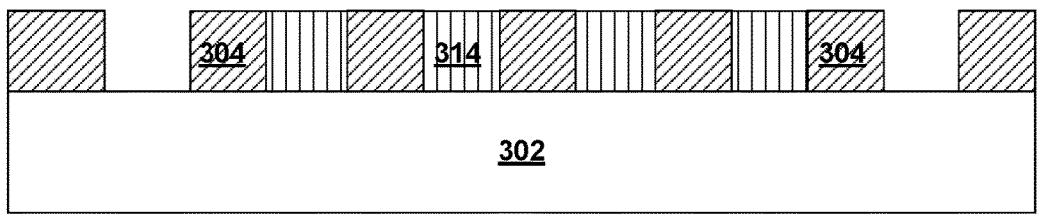
FIG. 3G is another cross sectional view illustrating the semiconductor device after removal of the temporary fill material from the trench area in accordance with an embodiment of the disclosure.

FIG. 3G is another cross sectional view illustrating the semiconductor device after removal of the temporary fill material from the trench area in accordance with an embodiment of the disclosure. The conductive inner core 314 remains in the core area, but the temporary fill material 312 has been removed according to the block 212.

Returning to the method 200, a magnetic winding coil is formed in the trench area at block 214. The magnetic winding coil is comprised of a magnetic material, such as NiZnCu—Fe2o4, YBi—Fe5o12, NiFe, and the like. The magnetic coil is formed within the trench area using a suitable process, such as spin coating, electroplating deposition, sputtering, chemical vapor deposition, and the like. Thereafter, excess magnetic material is removed using a suitable process, such as chemical mechanical planarization. The thickness of the magnetic core matches a thickness of the insulating layer 304, such as about 1 to 20 micro meters thick, in one example.

An example of a suitable spin coating method is to spin coat 40% Ni, 40% Zn and 20% Cu—Fe2O4. An example of another spin coating method is to spin coat 80% Y and 20% Bi and Fe5O12. An example of a suitable electroplating deposition is to electroplate Ni and Fe to yield low hysteresis and relatively high permeability. An example of a suitable sputtering method includes sputtering Ni and Fe and co-sputtering CoTa7r. It is appreciated that variations in the above magnetic coil formation process and magnetic material are contemplated.

It is appreciated that the magnetic winding can be utilized as part of the coupled-magnetic-core inductors 106, describe above.

It is further appreciated that redistribution layers (RDL) are formed to interconnect the core vias of the conductive inner core. The redistribution layers can be formed in the carrier layer prior to formation of the bonded or coated layer and/or over the insulating layer in the core area after formation of the conductive inner core.

Figure 3H:
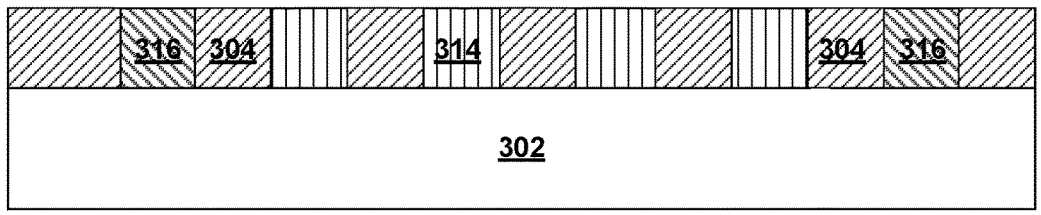
FIG. 3H is a cross sectional view of a magnetic coil formed in the trench area in accordance with an embodiment of the disclosure.

FIG. 3H is a cross sectional view of a magnetic coil formed in the trench area in accordance with an embodiment of the disclosure. A magnetic coil 316 is shown formed within the trench area according to the process described in block 214. Thus, this view shows the insulating layer 304 formed on the carrier layer 302, the conductive inner core 314 within the insulating layer 304, and the magnetic coil 316 within the bonded or coated layer 304.

Figure 3I:
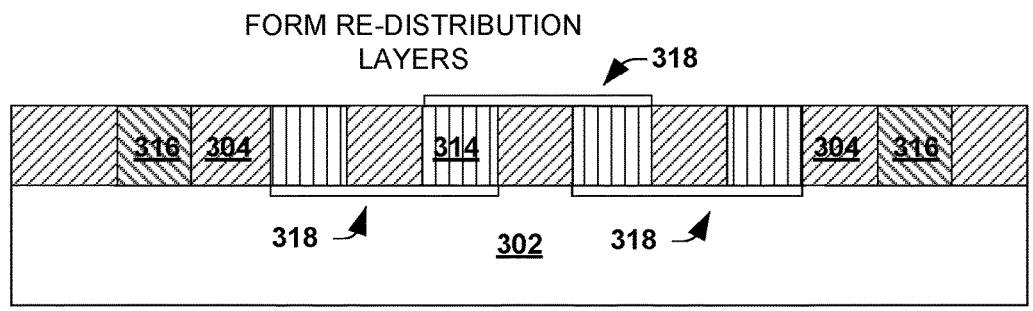
FIG. 3I is a cross sectional view of showing distribution layers in accordance with an embodiment of the disclosure.

FIG. 3I is a cross sectional view of showing redistribution layers in accordance with an embodiment of the disclosure. Here, the magnetic coil 316 has been formed in the trench area. Redistribution layers 318 are shown interconnecting conductive vias within the trench area.

Figure 3J:
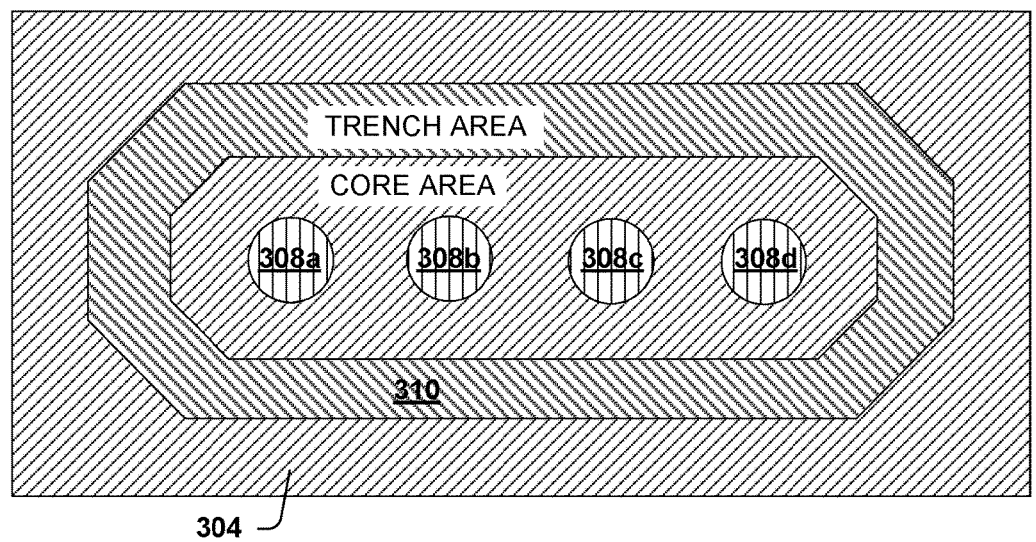
FIG. 3J is a top view of the semiconductor device after formation of the magnetic coil and the core area.

FIG. 3J is a top view of the semiconductor device after formation of the magnetic coil 316 and the core area 308. The core vias 308a, 308b, 308c, and 308d are shown filled with the conductive material 314. The trench area 310 is shown filled with the magnetic material 316.

It is appreciated that suitable variations of the method 200 are contemplated.

It will be appreciated that while reference is made throughout this document to exemplary structures in discussing aspects of methodologies described herein (e.g., the structure presented in above figures, while discussing the methodology set forth in above), that those methodologies are not to be limited by the corresponding structures presented. Rather, the methodologies (and structures) are to be considered independent of one another and able to stand alone and be practiced without regard to any of the particular aspects depicted in the Figures.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

An integrated voltage regulator system includes a control system and coupled-magnetic-core inductors. The control system is in a package. The coupled-magnetic-core inductors are also in the package. The control system is configured to utilize the coupled-magnetic-core inductors to generate a selected regulated voltage.

An integrated coupled-magnetic-core inductor formed within a package is disclosed. The inductor includes a package, a first layer (a bonded or coated layer or insulating substrate/layer), a trench area, a magnetic winding coil, a core area and conductive core vias. The first layer is formed on a carrier layer within the package. The trench area is formed within the first layer. The magnetic winding coil is formed within the trench area. The core area is formed within the bonded or coated layer. The core area is inside the trench area. Conductive core vias are formed within the core area.

A method of fabricating coupled-magnetic-core inductors for an integrated voltage regulator is disclosed. An insulating layer (bonded or coated layer) is attached upon a carrier layer within a package. The bonded or coated layer is patterned to form a core area and a trench area. A conductive inner core is formed within the core area. A magnetic winding coil is formed within the trench area.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A device, comprising:
   an insulating layer disposed over a silicon substrate, the insulating layer including a core insulating area and a peripheral insulating area, wherein a trench laterally encloses the core insulating area and separates the core insulating area from the peripheral insulating area;
   a magnetic winding coil disposed within the trench and separating the core insulating area from the peripheral insulating area; and
   a plurality of conductive inner cores disposed within the core insulating area and laterally surrounded by the magnetic winding coil, wherein the plurality of conductive inner cores are made of a first material that is electrically conductive, and the magnetic winding coil is made of a second material that is magnetic and differs from the first material, and wherein the magnetic winding coil establishes a ring-shaped enclosure around the plurality of conductive inner cores.

2. The device of claim 1, wherein the plurality of conductive inner cores have a plurality of centers, respectively, and neighboring centers are spaced apart from one another according to a regular interval.

3. The device of claim 1, wherein one of the plurality of conductive inner cores is a pillar having a circular shape as viewed from above an upper surface of the plurality of conductive inner cores.

4. The device of claim 3, wherein upper surfaces of the plurality of conductive inner cores are co-planar with an upper surface of the magnetic winding coil.

5. The device of claim 1, wherein the magnetic winding coil and the plurality of conductive inner cores each extend entirely through the insulating layer and each have a thickness ranging from 1 micrometer to 20 micrometers.

6. The device of claim 1, wherein the plurality of conductive inner cores are made of copper.

7. The device of claim 1, wherein the insulating layer is comprised of one or more of high-resistivity silicon, glass, spin-on-glass (SOG), spin-on dielectric (SOD), polymer, ceramic, or low temperature cofired ceramic (LTCC).

8. The device of claim 1, wherein the magnetic winding coil is made of NiZnCu, $Fe_2O_4$, YBi, $Fe_5O_{12}$, or NiFe.

9. A device, comprising:
   a semiconductor substrate;
   a magnetic winding coil over the semiconductor substrate;
   a plurality of conductive core structures disposed over the semiconductor substrate and being laterally surrounded by the magnetic winding coil, wherein the plurality of conductive core structures are made of a first material that is electrically conductive, and the magnetic winding coil is made of a second material that is magnetic and differs from the first material, and wherein the plurality of conductive core structures have a plurality of centers, respectively, and neighboring centers are spaced apart from one another according to a regular interval; and
   an insulating layer disposed over the semiconductor substrate, the insulating layer including a core insulating area and a peripheral insulating area, the core insulating area being laterally surrounded by the magnetic winding coil and separating the conductive core structures from one another, and the peripheral insulating area laterally surrounding the magnetic winding coil.

10. The device of claim 9, wherein the magnetic winding coil establishes a ring-shaped enclosure around the plurality of conductive core structures and separates the core insulating area from the peripheral insulating area.

11. The device of claim 9, wherein an upper surface of the magnetic winding coil is co-planar with upper surfaces of the plurality of conductive core structures.

12. The device of claim 9, wherein the magnetic winding coil and the plurality of conductive core structures each extend entirely through the insulating layer and each have a thickness ranging from 1 micrometer to 20 micrometers.

13. The device of claim 9, wherein the plurality of conductive core structures comprise copper.

14. The device of claim 9, wherein the magnetic winding coil comprises NiZnCu, $Fe_2O_4$, YBi, $Fe_5O_{12}$, or NiFe.

15. A device, comprising:
    a semiconductor substrate;
    a magnetic winding coil over the semiconductor substrate;
    a plurality of conductive core structures disposed over the semiconductor substrate and being laterally surrounded by the magnetic winding coil, wherein the plurality of conductive core structures are made of a first material that is electrically conductive, wherein the magnetic winding coil is made of a second material that is magnetic and differs from the first material, wherein the plurality of conductive core structures have a plurality of centers, respectively, and neighboring centers are spaced apart from one another according to a regular interval, wherein the plurality of conductive core structures comprise a plurality of pillars, respectively, each having a circular shape as viewed from above an upper surface thereof, and wherein the magnetic winding coil is an oval, rectangle, or polygon which entirely surrounds the plurality of conductive core structures as viewed from above; and
    an insulating layer disposed over the semiconductor substrate, the insulating layer including a core insulating area and a peripheral insulating area, the core insulating area being laterally surrounded by the magnetic winding coil and separating the conductive core structures from one another, and the peripheral insulating area laterally surrounding the magnetic winding coil.

16. The device of claim 15, wherein the insulating layer is comprised of one or more of high-resistivity silicon, glass, spin-on-glass (SOG), spin-on dielectric (SOD), polymer, ceramic, or low temperature cofired ceramic (LTCC).

17. The device of claim 15, wherein the plurality of conductive core structures are comprised of copper.

18. The device of claim 15, wherein an upper surface of the magnetic winding coil is co-planar with upper surfaces of the plurality of conductive core structures.

19. The device of claim 15, further comprising vias that electrically couple the magnetic winding coil and the plurality of conductive core structures to a control system configured to utilize the magnetic winding coil to generate a regulated voltage.

20. The device of claim 1, wherein the magnetic winding coil is an oval, rectangle, or polygon which entirely surrounds the conductive inner core as viewed from above.

* * * * *